United States Patent
Narioka

(10) Patent No.: US 11,137,680 B2
(45) Date of Patent: Oct. 5, 2021

(54) SHAPING APPARATUS AND ARTICLE MANUFACTURING METHOD

(71) Applicant: CANON KABUSHIKI KAISHA, Tokyo (JP)

(72) Inventor: Shintaro Narioka, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 352 days.

(21) Appl. No.: 16/141,304

(22) Filed: Sep. 25, 2018

(65) Prior Publication Data

US 2019/0094687 A1    Mar. 28, 2019

(30) Foreign Application Priority Data

Sep. 28, 2017 (JP) .............................. JP2017-187989
Jul. 20, 2018 (JP) .............................. JP2018-137097

(51) Int. Cl.
*G03F 7/00*      (2006.01)
*B29C 43/56*     (2006.01)
*B29C 59/02*     (2006.01)
*G03F 9/00*      (2006.01)
*H01L 21/027*    (2006.01)
(Continued)

(52) U.S. Cl.
CPC ............ *G03F 7/0002* (2013.01); *B29C 43/56* (2013.01); *B29C 59/02* (2013.01); *G03F 9/7073* (2013.01); *H01L 21/027* (2013.01); *H01L 21/31058* (2013.01); *H01L 21/31144* (2013.01)

(58) Field of Classification Search
None
See application file for complete search history.

(56) References Cited

U.S. PATENT DOCUMENTS 8,394,282 B2   3/2013  Panga et al.
9,415,418 B2   8/2016  Sreenivasan et al.
(Continued)

FOREIGN PATENT DOCUMENTS

JP    2015138842 A   7/2015
JP     5828626 B2   12/2015
(Continued)

OTHER PUBLICATIONS

English translation of Office Action issued in Korean Appln. No. 10-2018-0112587 dated Feb. 22, 2021, previously cited on Mar. 9, 2021.

Primary Examiner — Matthew J Daniels
Assistant Examiner — Paul Spiel
(74) Attorney, Agent, or Firm — Rossi, Kimms & McDowell LLP

(57) ABSTRACT

A shaping apparatus that shapes a composition on a substrate by using a mold, includes a substrate positioning mechanism for positioning the substrate, a mold positioning mechanism for positioning the mold, a dispenser for arranging the composition on a shot region of the substrate, and a gas supply for supplying a gas onto the substrate from a gas supply port in a state in which the substrate is driven by the substrate positioning mechanism. A flow rate of the gas supplied onto the substrate by the gas supply starts to decrease in a period during which the substrate is driven by the substrate positioning mechanism so that the shot region where the composition is arranged by the dispenser is moved under the mold.

13 Claims, 9 Drawing Sheets

(51) Int. Cl.
*H01L 21/311* (2006.01)
*H01L 21/3105* (2006.01)

(56) References Cited

U.S. PATENT DOCUMENTS

2012/0080820 A1    4/2012  Narioka et al.
2014/0327183 A1*  11/2014  Mori .................... G03F 7/0002
                                                                 264/293
2016/0327857 A1   11/2016  Kimura

FOREIGN PATENT DOCUMENTS

JP        2016201485 A    12/2016
KR      1020140116209 A   10/2014

* cited by examiner

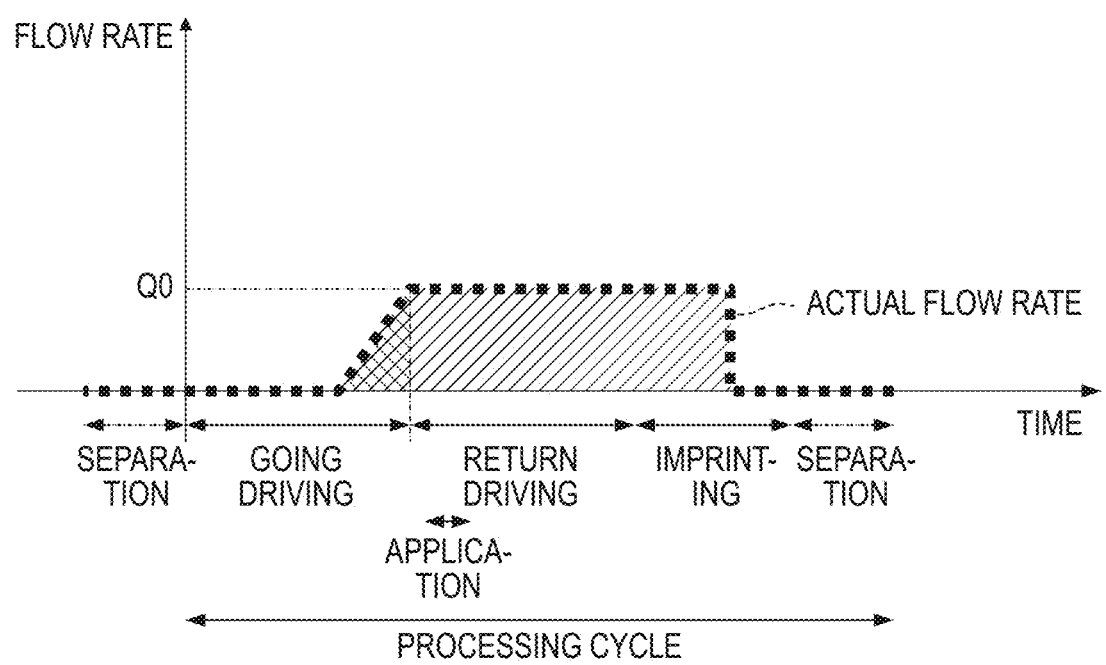

SHAPING APPARATUS AND ARTICLE MANUFACTURING METHOD

BACKGROUND OF THE INVENTION

Field of the Invention

The present invention relates to a shaping apparatus and an article manufacturing method.

Description of the Related Art

An imprint apparatus serving as one type of shaping apparatus arranges an imprint material on a substrate, brings a pattern region of a mold into contact with the imprint material, and cures the imprint material. Consequently, a pattern in the pattern region of the mold is transferred to the imprint material on the substrate. The pattern region of the mold includes a concave portion that forms the pattern, and the concave portion is filled with the imprint material on the substrate by bringing the pattern region of the mold into contact with the imprint material. Because a considerable time is taken in order to fill the concave portion in the pattern region of the mold with the imprint material, this can be a cause of decreasing throughput. To cope with this, by supplying a gas (for example, helium gas) having high solubility and/or diffusibility with respect to the imprint material between the substrate and the mold, it is possible to reduce an inhibition in filling the concave portion in the pattern region of the mold with the imprint material by a gas in the concave portion.

Japanese Patent No. 5828626 describes a technique of arranging a gas supply position in a moving path where a shot region to which a resin (imprint material) is applied is moved immediately below a mask (mold) and starting to supply a gas before the shot region to which the resin is applied passes through the supply position. Japanese Patent Laid-Open No. 2015-138842 describes a technique of controlling a gas flow rate from a gas supply in accordance with the area of a portion where an original (mold) and a substrate overlap when viewed from the top after relatively moving the original and the substrate so that a shot region of the substrate is positioned immediately below the original.

Because the above-described gas to be supplied between the substrate and the mold is very expensive, the use amount of such a gas needs to be reduced. If the use amount of the gas is reduced simply, however, a pattern defect owing to a filling failure or the like may occur.

SUMMARY OF THE INVENTION

The present invention provides a technique advantageous in reducing the use amount of a gas to be supplied between a substrate and a mold.

According to an aspect of the present invention, there is provided a shaping apparatus that shapes a composition on a substrate by using a mold, the apparatus comprising: a substrate positioning mechanism configured to position the substrate; a mold positioning mechanism configured to position the mold; a dispenser configured to arrange the composition on a shot region of the substrate; and a gas supply including a gas supply port arranged between the dispenser and the mold positioning mechanism, and configured to supply a gas onto the substrate from the gas supply port in a state in which the substrate is driven by the substrate positioning mechanism, wherein a flow rate of the gas supplied onto the substrate by the gas supply starts to decrease in a period during which the substrate is driven by the substrate positioning mechanism so that the shot region where the composition is arranged by the dispenser is moved under the mold.

Further features of the present invention will become apparent from the following description of exemplary embodiments with reference to the attached drawings.

BRIEF DESCRIPTION OF THE DRAWINGS

FIG. 7 is a graph showing a comparative example;

DESCRIPTION OF THE EMBODIMENTS

The present invention will be described below with reference to the accompanying drawings by way of exemplary embodiments.

Figure 1:
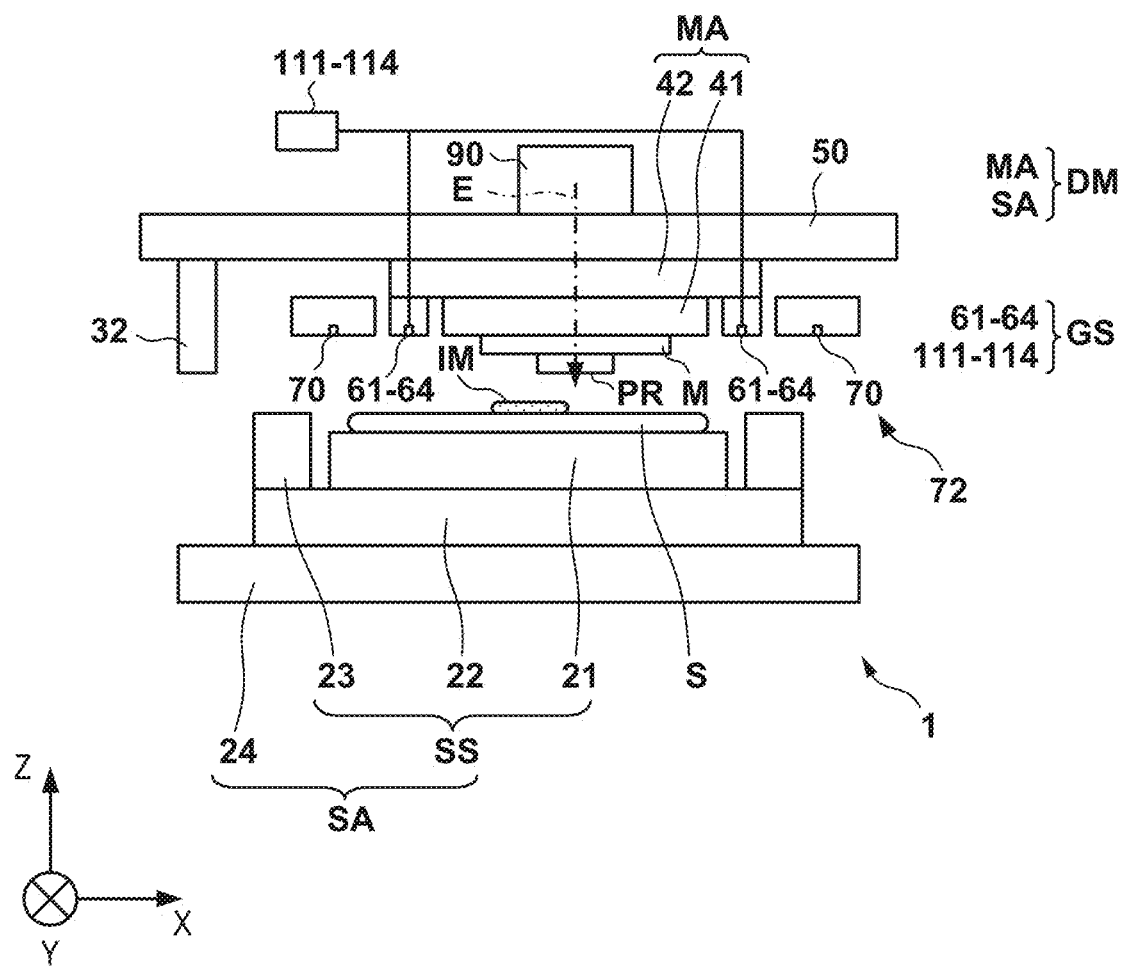
FIG. 1 is a side view schematically showing the arrangement of a shaping apparatus according to an embodiment of the present invention.
Figure 2:
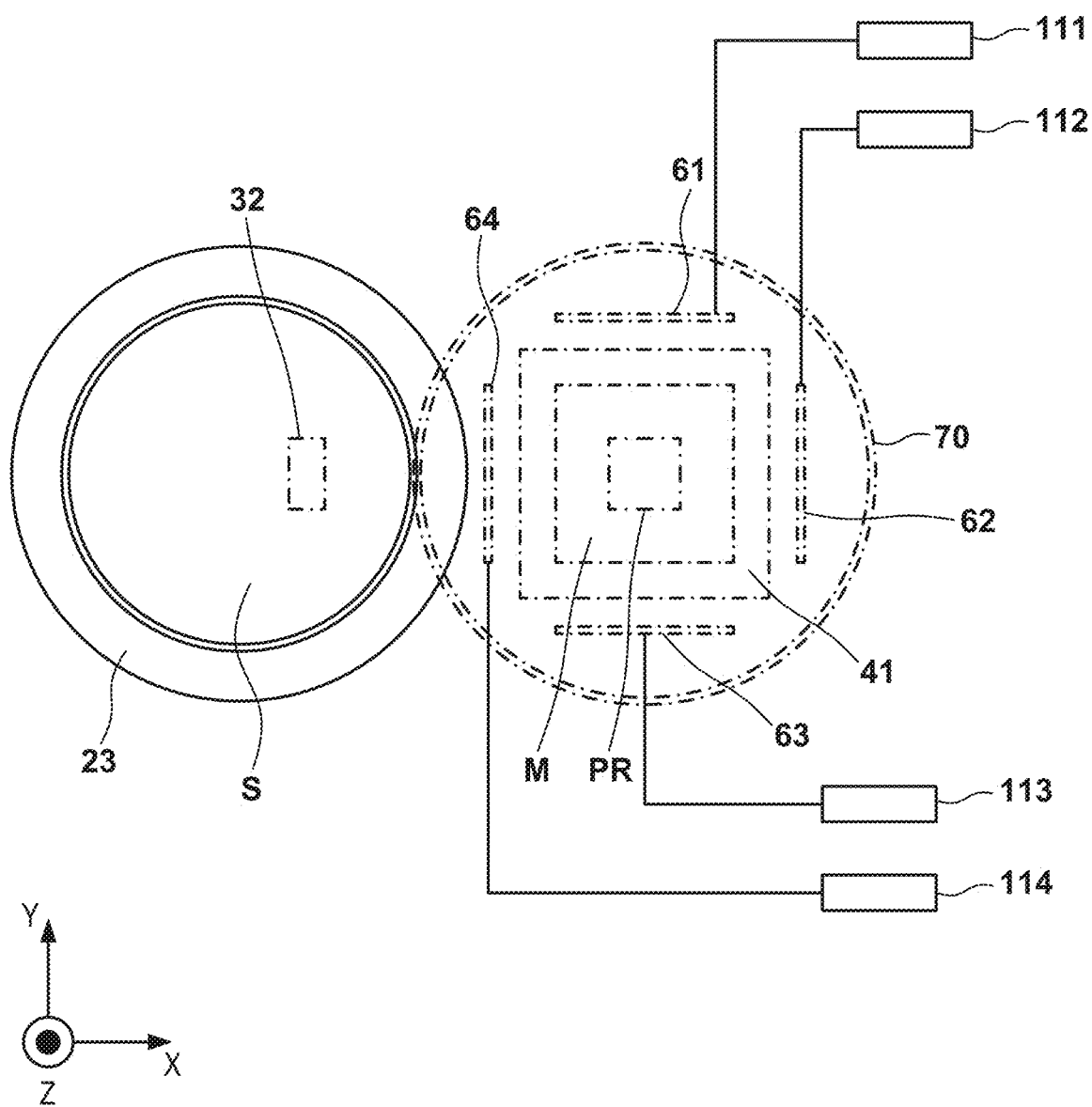
FIG. 2 is a plan view schematically showing the arrangement of the shaping apparatus according to the embodiment of the present invention.

FIGS. 1 and 2 are a side sectional view and a plan view schematically showing the arrangement of an imprint apparatus 1 according to an embodiment of the present invention. The imprint apparatus 1 arranges an imprint material IM on a substrate S, brings a pattern region PR of a mold M into contact with the imprint material IM, and cures the imprint material IM. Consequently, a pattern is formed on the substrate S. The imprint apparatus 1 can be understood as one type of shaping apparatus that shapes a composition (or an imprint material) on the substrate S by using the mold.

A curable composition (to be sometimes referred to as an uncured resin hereinafter) that is cured by receiving curing energy is used as the imprint material. An electromagnetic wave, heat, or the like can be used as the curing energy. The electromagnetic wave can be, for example, light such as infrared light, visible light, or ultraviolet light whose wavelength is selected within a range of 10 nm (inclusive) to 1 mm (inclusive). The curable composition can be a composition that is cured by light irradiation or application of heat. Out of these compositions, a photo-curable composition that is cured by light irradiation contains at least a polymerizable compound and a photopolymerization initiator, and may further contain a non-polymerizable compound or solvent, as needed. The non-polymerizable compound is at least a material selected from the group consisting of a sensitizer, a hydrogen donor, an internal mold release agent, a surfactant, an antioxidant, a polymer component, and the like. The imprint material can be arranged on the substrate in a droplet-like shape, or an island-like shape or a film-like shape formed by a plurality of droplets connected to each other. The viscosity (viscosity at 25° C.) of the imprint material can fall within, for example, a range of 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

In this specification and the accompanying drawings, directions are shown in an X-Y-Z coordinate system in which a direction parallel to the surface of the substrate S forms an X-Y plane. Let X, Y, and Z directions be directions parallel to X-, Y-, and Z-axes in the X-Y-Z coordinate system, respectively. Let θX, θY, and θZ be rotation about the X-axis, rotation about the Y-axis, and rotation about the Z-axis, respectively. Control or driving operations with respect to the X-, Y-, and Z-axes indicate control or driving operations with respect to the directions parallel to the X-, Y-, and Z-axes, respectively. Furthermore, control or driving operations with respect to θX-, θY-, and θZ-axes indicate control or driving operations with respect to rotation about an axis parallel to the X-axis, rotation about an axis parallel to the Y-axis, and rotation about an axis parallel to the Z-axis, respectively. A position is information that can be specified based on coordinates on the X-, Y-, and Z-axes. An orientation is information that can be specified by values on the θX-, θY-, and θZ-axes. Positioning indicates control of the position and/or orientation. Alignment can include control of the position and/or orientation of at least one of the substrate and the mold.

The imprint apparatus 1 can include a substrate positioning mechanism SA that holds and positions the substrate S, a mold positioning mechanism MA that holds and positions the mold M, and a support mechanism 50 that supports the mold positioning mechanism MA. The substrate positioning mechanism SA and the mold positioning mechanism MA form a drive mechanism DM that drives at least one of the substrate S and the mold M so that the relative position of the substrate S and the mold M is adjusted. Adjustment of the relative position by the drive mechanism DM includes contact of the mold M with the imprint material IM on the substrate S and driving for separating the mold M from the cured imprint material (a pattern of a cured product). Adjustment of the relative position by the drive mechanism DM includes driving for positioning the mold M and a shot region of the substrate S.

The substrate positioning mechanism SA includes a substrate stage SS that holds the substrate S and a substrate drive mechanism 24 that drives the substrate S by driving the substrate stage SS. The substrate stage SS can include a substrate chuck 21 that holds the substrate S and a table 22 that supports the substrate chuck 21. The substrate stage SS can also include a flush plate 23 that surrounds the periphery of the substrate S. The surface of the flush plate 23 can have almost the same height as the surface of the substrate S. The mold positioning mechanism MA can include a mold chuck 41 that holds the mold M and a mold drive mechanism 42 that drives the mold M by driving the mold chuck 41.

The substrate positioning mechanism SA (substrate drive mechanism 24) can be configured to drive the substrate S with respect to a plurality of axes (for example, three axes of the X-, Y-, and θZ-axes, preferably six axes of the X-, Y-, Z-, θX-, θY-, and θZ-axes). The mold drive mechanism MA (mold drive mechanism 42) can be configured to drive the mold M with respect to a plurality of axes (for example, three axes of the Z-, θX-, and θY-axes, preferably six axes of the X-, Y-, Z-, θX-, θY-, and θZ-axes).

The imprint apparatus 1 includes a curing unit 90 and a dispenser 32. The curing unit 90 irradiates the imprint material with curing energy E in a state in which the pattern region PR of the mold M and the imprint material IM on the shot region of the substrate S are in contact, and a concave portion that forms a pattern of the pattern region PR is filled with the imprint material. The dispenser 32 supplies the imprint material IM onto the substrate S. The dispenser 32 arranges the imprint material IM at a target position on the substrate S by, for example, discharging the imprint material IM in a state in which the substrate S is moved by the substrate positioning mechanism SA.

The imprint apparatus 1 also includes a gas supply GS that supplies a gas between the substrate S and the mold M (a space thereof). This gas can also be referred to as a purge gas or a filling acceleration gas. As the purge gas, a gas having at least one of solubility and diffusibility with respect to the imprint material, for example, at least one of helium gas and nitrogen gas is preferable. Owing to solubility or diffusibility, the purge gas in the concave portion that forms the pattern of the pattern region PR of the mold M dissolves or diffuses into the imprint material IM, filling the concave portion with the imprint material IM quickly. Alternatively, as the purge gas, a condensable gas (for example, pentafluoropropane (PFP)) is preferable. The condensable gas in the concave portion that forms the pattern of the pattern region PR of the mold M decreases in volume considerably by being condensed when it contacts the imprint material IM, thereby filling the concave portion with the imprint material IM quickly.

The gas supply GS includes a gas supply port 64 arranged between the dispenser 32 and the mold positioning mechanism MA, and supplies a gas onto the substrate S from the gas supply port 64 in a state in which the substrate S is driven by the substrate positioning mechanism SA. The gas supply GS may include a plurality of gas supply ports 61 to 64 including the gas supply ports 64, and the plurality gas supply ports 61 to 64 can be arranged on the periphery of the mold M. The gas supply GS can be arranged between a gas supply source (not shown) and each of the plurality of gas supply ports 61 to 64, and include flow rate regulating mechanisms 111 to 114 capable of individually regulating the flow rates of gases supplied from the plurality of gas supply ports 61 to 64. The plurality of gas supply ports 61 to 64 may be provided in the mold chuck 41 or a member fixed to the mold chuck 41, may be provided in the mold drive mechanism 42 or a member fixed to the mold drive mechanism 42, or may be provided in a structure independent of the mold positioning mechanism MA.

The gas supply GS supplies the purge gas onto the substrate S from the gas supply port 64 arranged between the dispenser 32 and the mold positioning mechanism MA in the state in which the substrate S is driven by the substrate positioning mechanism SA. Note that the flow rate of the purge gas starts to decrease in a period during which the substrate S is driven by the substrate positioning mechanism SA so that a shot region where the imprint material IM is arranged by the dispenser 32 is moved under the mold M (to be referred to as return driving mechanism hereinafter). With this control as well, the purge gas is supplied between the mold M and the shot region where the imprint material IM is arranged by the Couette flow generated by driving the substrate S by the substrate positioning mechanism SA. It is possible to reduce purge gas consumption by the start of decrease in flow rate of the purge gas in a driving period.

The imprint apparatus 1 may further include a second gas supply 72 that includes a second gas supply port 70 arranged on the periphery of the mold positioning mechanism MA. The gas supply ports 61 to 64 can be arranged between the mold positioning mechanism MA (mold M) and the second gas supply port 70. The second gas supply 72 discharges the second gas so as to suppress the entrance of particles between the substrate S and the mold M. The second gas can be a gas such as air where particles are removed or reduced.

Figure 3A:
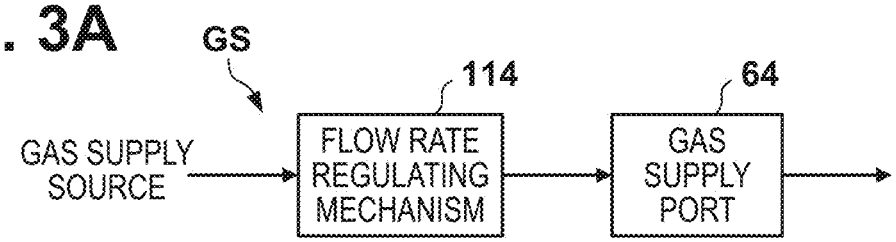
FIG. 3A is a block diagram showing the arrangement of a gas supply according to the first embodiment.

FIG. 3A schematically shows the arrangement of the gas supply GS according to the first embodiment. FIG. 3A does not show the gas supply ports 61 to 63 and the flow rate regulating mechanisms 111 to 113. However, they can have the same arrangement as the gas supply port 64 and the flow rate regulating mechanism 114. In a return driving period, supply of the purge gas from the gas supply ports 61 to 63 may be controlled auxiliarily or in the same manner as supply of the purge gas from the gas supply port 64. Alternatively, in the return driving period, the purge gas may not be supplied from the gas supply ports 61 to 63. The flow rate regulating mechanisms 111 to 114 can include mass flow controllers.

Figure 3B:
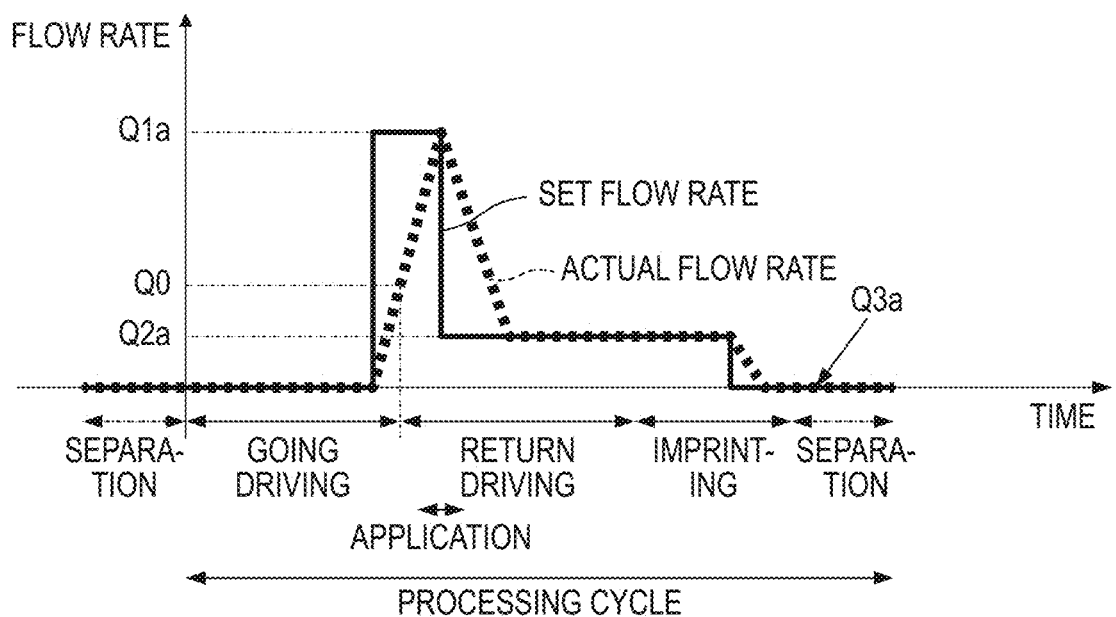
FIG. 3B is a graph showing an example of the supply control of a purge gas in one processing cycle according to the first embodiment.

FIG. 3B shows supply control of a purge gas in one processing cycle according to the first embodiment. FIG. 7 shows supply control of a purge gas in a processing cycle according to a comparative example. Referring to FIGS. 3B and 7, the abscissa indicates a time, and the ordinate indicates a supply amount of the purge gas from the gas supply port 64. Referring to FIGS. 3B and 7, the area of a flow rate (actual flow rate) corresponds to purge gas consumption.

"Separation" indicated by each alternate long and short dashed line means separation between the mold M and the cured imprint material IM in an immediately preceding processing cycle. One processing cycle includes "going driving", "return driving", "imprint", and "separation" concerning a shot region of a processing target out of a plurality of shot regions. "Going driving" means driving by the substrate positioning mechanism SA in order to move the shot region of the processing target to a position at which the dispenser 32 starts to apply the imprint material IM. "Return driving" means driving by the substrate positioning mechanism SA in order to arrange the shot region of the processing target at a position immediately below the pattern region PR of the mold M. In this example, in "return driving", the imprint material IM is applied (arranged) by the dispenser 32 on the shot region of the processing target. In "going driving", however, the imprint material IM may be applied (arranged) by the dispenser 32 on the shot region of the processing target. "Imprint" means a process that includes contact between the pattern region PR of the mold M and the imprint material IM on the shot region of the processing target, filling of the concave portion of the pattern region PR with the imprint material IM, and curing of the imprint material IM by the curing unit 90. "Separation" means separation between the cured imprint material IM and the pattern region PR of the mold M.

The purge gas need not always be discharged from the gas supply port 64 in order to arrange the purge gas between the mold M and the shot region of the processing target of the substrate S. It is only necessary that supply of a gas onto the substrate S is started, for example, after driving of the substrate S by the substrate positioning mechanism SA is started (after going driving is started) so as to bring a shot region where the imprint material is to be arranged by the dispenser 32 closer to the dispenser 32. This makes it possible reduce purge gas consumption.

Supply of the gas onto the substrate S may be started at a start timing (start timing of return driving) of driving of the substrate S by the substrate positioning mechanism SA for arranging the shot region of the processing target at a position immediately below the mold M. Alternatively, supply of the gas onto the substrate S may be started at a timing when the dispenser 32 starts to supply the imprint material to the shot region. With these kinds of control, it is possible to further reduce the purge gas consumption. It is also possible to further reduce the purge gas consumption if supply of the gas onto the substrate S is started at a timing when the shot region where the imprint material IM is arranged by the dispenser 32 faces the gas supply port 64. That is, the timing at which supply of the gas onto the substrate S is started may be the start timing of return driving, or may be before or after the start timing.

It should be considered here that a flow rate set in the flow rate regulating mechanism 114 and an actual flow rate do not match, for example, the actual flow rate has a time delay with respect to the flow rate set in the flow rate regulating mechanism 114. Note that in order to accelerate filling of the concave portion of the pattern region PR with the imprint material IM, let Q0 be a flow rate of the purge gas needed at a given reference timing. The reference timing can be determined arbitrarily. The reference timing will be described below as the start timing of return driving as an example.

In the comparative example shown in FIG. 7, in order to control the flow rate of a purge gas so that the flow rate of the purge gas reaches Q0 at a start timing of return driving as a reference timing, supply (discharge) of a gas needs to be started at a timing which is earlier than the start timing of return driving. Therefore, purge gas consumption corresponding to the area of a crosshatched portion is additional consumption caused by a time delay of an actual flow rate with respect to a flow rate set in a flow rate regulating mechanism 114. If there is no time delay of the actual flow rate with respect to the flow rate set in the flow rate regulating mechanism 114, the purge gas consumption is reduced to consumption corresponding to the area of the single-hatched portion.

In the first embodiment, the set flow rate of the flow rate regulating mechanism 114 becomes a first set flow rate Q1$a$ which is larger than Q0 at a timing which is earlier than the start timing of return driving as an example of the reference timing so that the flow rate of the purge gas reaches Q0 at the start timing of return driving. Furthermore, in the first embodiment, in a period when return driving is performed, the set flow rate of the flow rate regulating mechanism 114 becomes a second set flow rate Q2$a$ which is smaller than Q0 and Q1$a$. Note that a timing at which the set flow rate of the flow rate regulating mechanism 114 changes from Q1$a$ to Q2$a$ may be within a period in which the dispenser 32 supplies the imprint material or may be after the period. The set flow rate of the flow rate regulating mechanism 114 is a flow rate set in the flow rate regulating mechanism 114 and indicated by a black solid line in FIG. 3B. If the flow rate regulating mechanism 114 includes the mass flow controller, the set flow rate can be a flow rate command value for the mass flow controller. A flow rate actually supplied from the gas supply port 64 (actual flow rate) is indicated by a thick gray solid line in FIG. 3B.

The flow rate of the purge gas supplied onto the substrate S by the gas supply GS starts to decrease in the period during which the substrate S is driven by the substrate positioning mechanism SA so that the shot region where the imprint material is arranged by the dispenser 32 is moved under the mold M. Then, the flow rate of the purge gas decreases up to $Q2a$ which is smaller than $Q0$ in the period. This makes it possible to reduce the purge gas consumption. A time required for the actual flow rate to reach $Q0$ can be shortened by making $Q1a$ be a value which is larger than $Q0$. This also makes it possible to reduce the purge gas consumption.

Figure 3C:
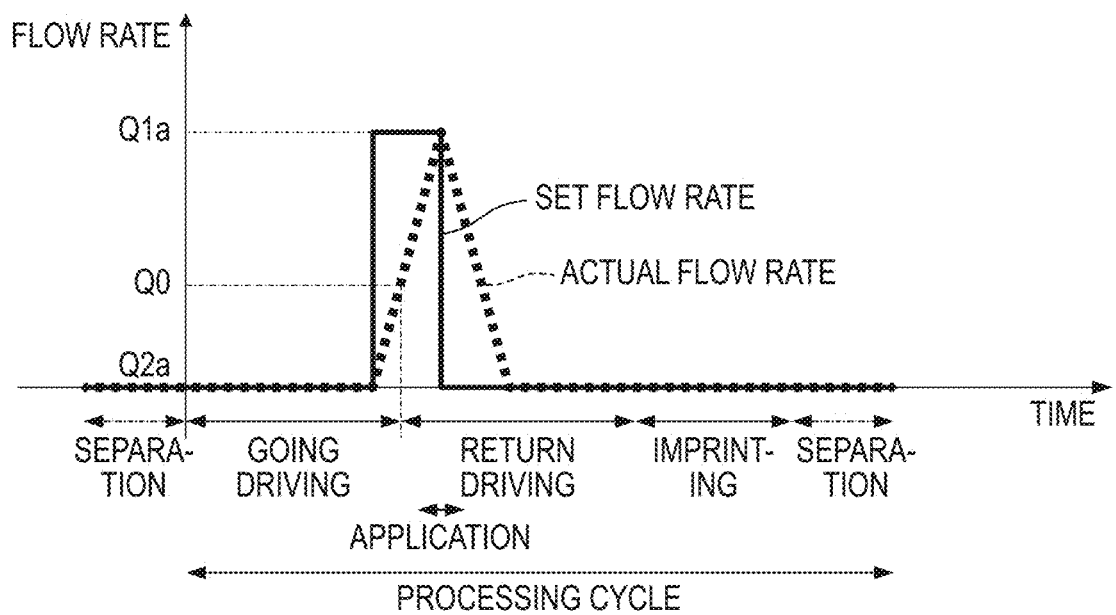
FIG. 3C is a graph showing another example of the supply control of the purge gas in one processing cycle according to the first embodiment.

In the examples of FIGS. 3B and 3C, the flow rate of the gas supplied onto the substrate S increases, and then decreases, in the period during which the substrate S is driven by the substrate positioning mechanism SA so that the shot region where the imprint material is arranged is moved under the mold M. Moreover, in the examples of FIGS. 3B and 3C, the flow rate of the gas supplied onto the substrate S increases, and then decreases, and then becomes constant, in the period during which the substrate S is driven by the substrate positioning mechanism SA so that the shot region where the imprint material is arranged is moved under the mold M.

In the above-described control, it is confirmed that the concentration of the purge gas between the mold M and the shot region of the substrate S is the same as that in the comparative example shown in FIG. 7. It is also confirmed that the purge gas consumption is reduced as compared with that in the comparative example shown in FIG. 7.

As shown in FIG. 3C, $Q2a$ may be 0. In this case, the actual flow rate of the purge gas can be 0 during the period of return driving. The purge gas discharged from the gas supply port 64 exists on the substrate S, and thus moves to a position below the mold M along with movement of the substrate S.

Following return driving, imprinting is started. As described above, imprinting includes contact between the pattern region PR of the mold M and the imprint material IM on the shot region of the processing target, filling of the concave portion of the pattern region PR with the imprint material IM, and curing of the imprint material IM by the curing unit 90. A distance between the substrate S and the mold M becomes smaller by contact between the pattern region PR of the mold M and the imprint material IM. Therefore, the concentration of the purge gas between the substrate S and the mold M is increased or maintained. It is difficult to control the concentration of the purge gas between the substrate S and the mold M by supplying the purge gas from the gas supply port 64 in this state. Therefore, in an imprint period, the set flow rate of the flow rate regulating mechanism 114 can be changed to $Q3a$ which is smaller than $Q2a$. $Q3a$ can be, for example, 0. The gas supply GS can be configured to stop supplying the gas onto the substrate S before separation between the mold M and the cured imprint material is complete.

The values of $Q1a$, $Q2a$, and $Q3a$ can be adjusted in accordance with the position of the shot region of the processing target on the substrate S, process conditions, or the like. Thus, the set flow rate of the purge gas can be changed in accordance with the position of the shot region of the processing target on the substrate S. The imprint apparatus 1 can include a terminal such as a console that forms a user interface, and the terminal can provide a default set flow rate as the set flow rate of the purge gas. A user can decide a more preferable set flow rate with reference to the default set flow rate.

The values of $Q1a$, $Q2a$, and $Q3a$ may be set by a recipe file (control information file) for controlling the process of a lot formed by one or a plurality of substrates in the imprint apparatus 1.

Figure 4A:
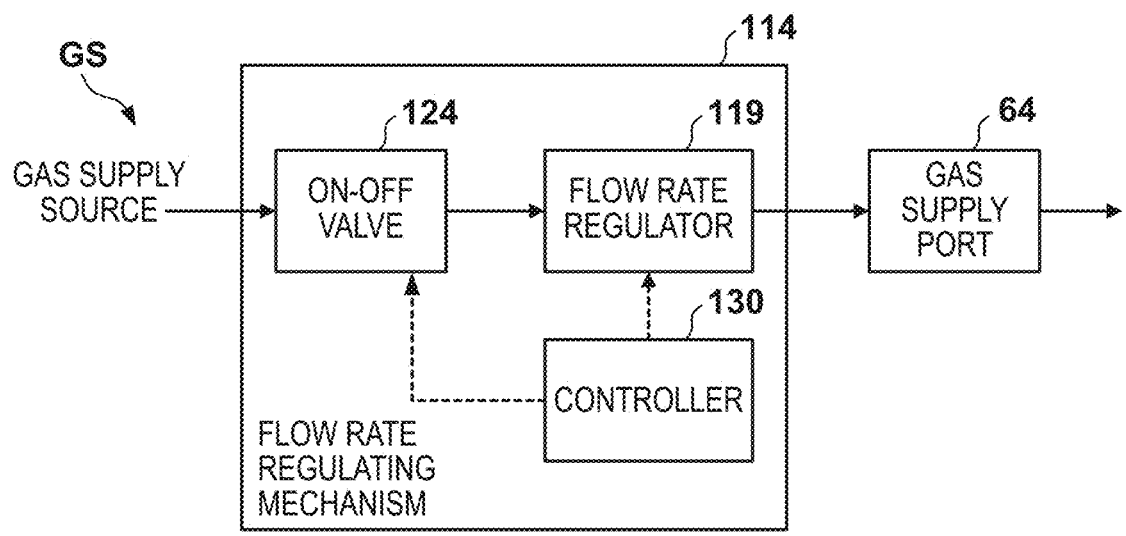
FIG. 4A is a block diagram showing the arrangement of a gas supply according to the second embodiment.
Figure 4B:
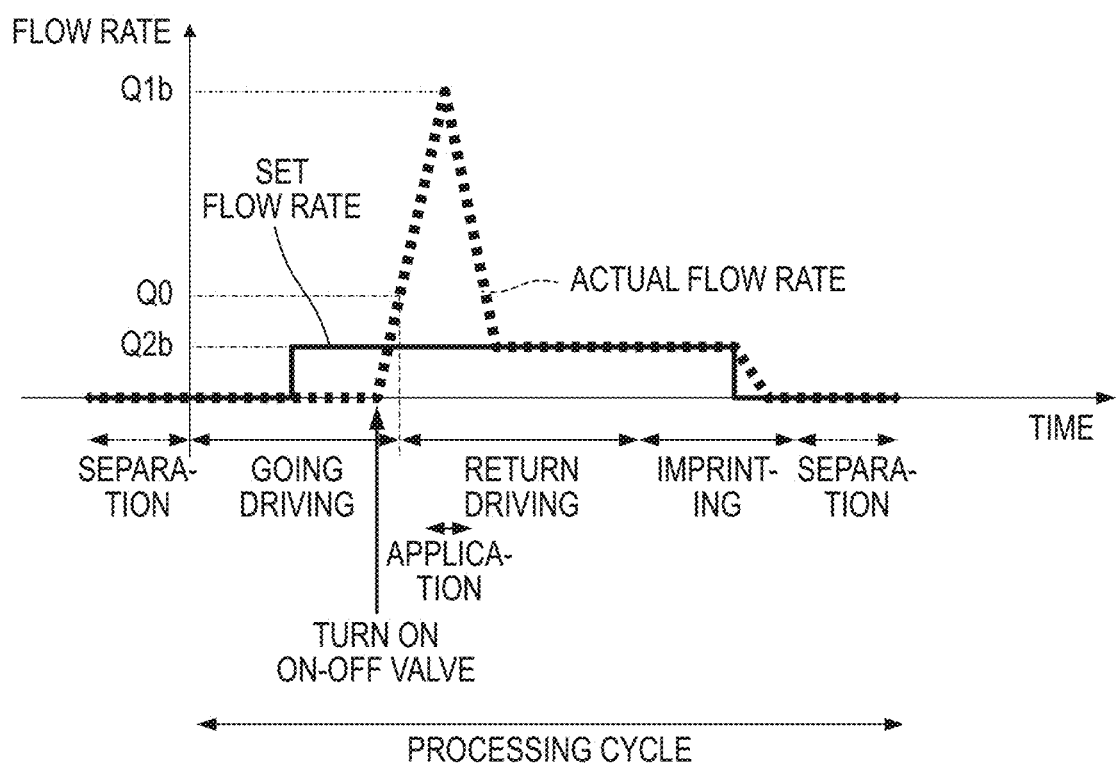
FIG. 4B is a graph showing the supply control of a purge gas in one processing cycle according to the second embodiment.

An imprint apparatus 1 according to the second embodiment of the present invention will be described below with reference to FIGS. 4A and 4B. Matters that are not mentioned as the second embodiment can comply with the first embodiment. FIG. 4A shows the arrangement of a gas supply GS in the imprint apparatus 1 according to the second embodiment of the present invention. FIG. 4B shows the supply control of a purge gas in one processing cycle according to the second embodiment. Note that a notation in FIG. 4B complies with a notation in FIG. 3B. FIG. 4A does not show gas supply ports 61 to 63 and flow rate regulating mechanisms 111 to 113. However, they can have the same arrangement as a gas supply port 64 and a flow rate regulating mechanism 114. In a driving period, supply of the purge gas from the gas supply ports 61 to 63 may be controlled auxiliarily or in the same manner as supply of the purge gas from the gas supply port 64. Alternatively, in the driving period, the purge gas may not be supplied from the gas supply ports 61 to 63.

The gas supply GS of the second embodiment includes the flow rate regulating mechanism 114 arranged between a gas supply source and the gas supply port 64. The flow rate regulating mechanism 114 can include a flow rate regulator 119 and an on-off valve 124 arranged between the gas supply port 64 and the gas supply source, and a controller 130 that controls the flow rate regulator 119 and the on-off valve 124. The controller 130 may be shared in the flow rate regulating mechanisms 111 to 114. The flow rate regulator 119 is configured to perform, based on a flow rate command value transmitted from the controller 130, feedback control of the flow rate of a purge gas passing through the flow rate regulator 119. The flow rate regulator 119 can include, for example, a mass flow controller. The flow rate regulator 119 may be arranged between the on-off valve 124 and the gas supply port 64 as shown in FIG. 4A or may be arranged between the gas supply source and the on-off valve 124.

In the second embodiment, the controller 130 changes the flow rate command value given to the flow rate regulator 119 from 0 to a first command value $Q2b$ at the first timing, which is earlier than a start timing of return driving as an example of a reference timing, in a period during which the on-off valve 124 is in a closed state. The first command value $Q2b$ is smaller than $Q0$ and larger than 0. Subsequently, the controller 130 changes the on-off valve 124 from the closed state to an open state at the second timing which is earlier than the start timing of return driving but later than the first timing. That is, the controller 130 sets the on-off valve 124 in the closed state and sets the flow rate command value for the flow rate regulator 119 to the first command value $Q2b$, and then the controller 130 sets the on-off valve 124 in the open state. Consequently, the flow rate of a purge gas supplied onto a substrate S by the gas supply GS increases up to $Q1b$, and then decreases, in a period during which the substrate S is driven by a substrate positioning mechanism SA so that a shot region where an imprint material is arranged is moved under a mold M.

The principle of changing the flow rate of the purge gas as described above will be described below. As described above, the flow rate regulator 119 is configured to perform, based on the flow rate command value transmitted from the controller 130, the feedback control of the flow rate of the purge gas passing through the flow rate regulator 119. Therefore, the flow rate regulator 119 performs feedback control of the opening rate of a valve of the flow rate regulator 119 so that the flow rate of the purge gas passing through the flow rate regulator 119 matches the first command value Q2b serving as the flow rate command value. In this state, however, the on-off valve 124 is set in the closed state, and thus the flow rate of the purge gas passing through the flow rate regulator 119 remains 0. Accordingly, the opening rate of the valve of the flow rate regulator 119 is regulated to the maximum opening rate.

Then, the on-off valve 124 is changed from the closed state to the open state in a state in which the opening rate of the valve of the flow rate regulator 119 is at maximum. Consequently, the flow rate of the purge gas passing through the flow rate regulator 119 overshoots up to Q1b beyond Q2b. Q2b can be larger than Q0. Subsequently, the feedback control of the flow rate regulator 119 functions correctly, and the flow rate of the purge gas flowing through the flow rate regulator 119 can converge to the first command value Q2b.

Therefore, in the second embodiment as well, the flow rate of the purge gas supplied onto the substrate S by the gas supply GS starts to decrease in the period during which the substrate S is driven by the substrate positioning mechanism SA so that the shot region where the imprint material is arranged is moved under the mold M.

In the example of FIG. 4B, the flow rate of a gas supplied onto the substrate S increases, and then decreases, in the period during which the substrate S is driven by the substrate positioning mechanism SA so that the shot region where the imprint material is arranged is moved under the mold M. Moreover, in the example of FIG. 4B, the flow rate of the gas supplied onto the substrate S increases, and then decreases, and then becomes constant, in the period during which the substrate S is driven by the substrate positioning mechanism SA so that the shot region where the imprint material is arranged is moved under the mold M.

A timing at which the flow rate command value for the flow rate regulator 119 is changed to Q2b is not limited to be within the period of going driving and may be, for example, within a period in which the mold M and a cured imprint material IM are separated from each other in an immediately preceding processing cycle.

A timing at which the on-off valve 124 is changed from the closed state to the open state is not limited to be within the period of going driving either and can be, for example, after the start timing of return driving and before a timing at which a shot region of a processing target faces the mold M. A time required to switch the on-off valve 124 from the closed state to the open state is generally shorter than a time required to change the opening rate of the flow rate regulator 119. Hence, the second embodiment is more advantageous than the first embodiment in order to speed up rising of the flow rate.

Figure 5A:
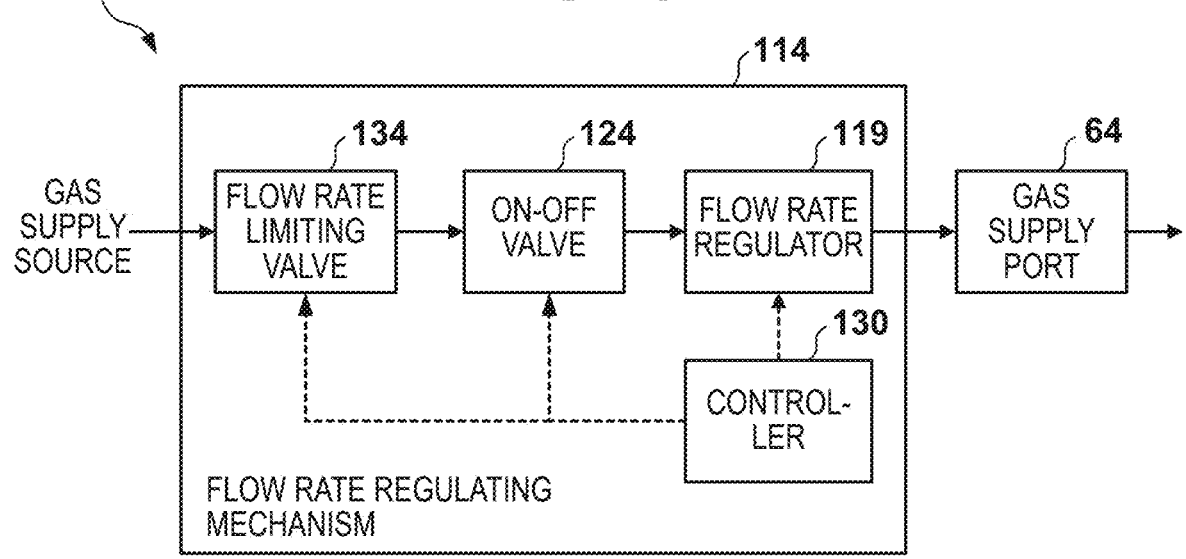
FIG. 5A is a block diagram showing the arrangement of a gas supply according to the third embodiment.
Figure 5B:
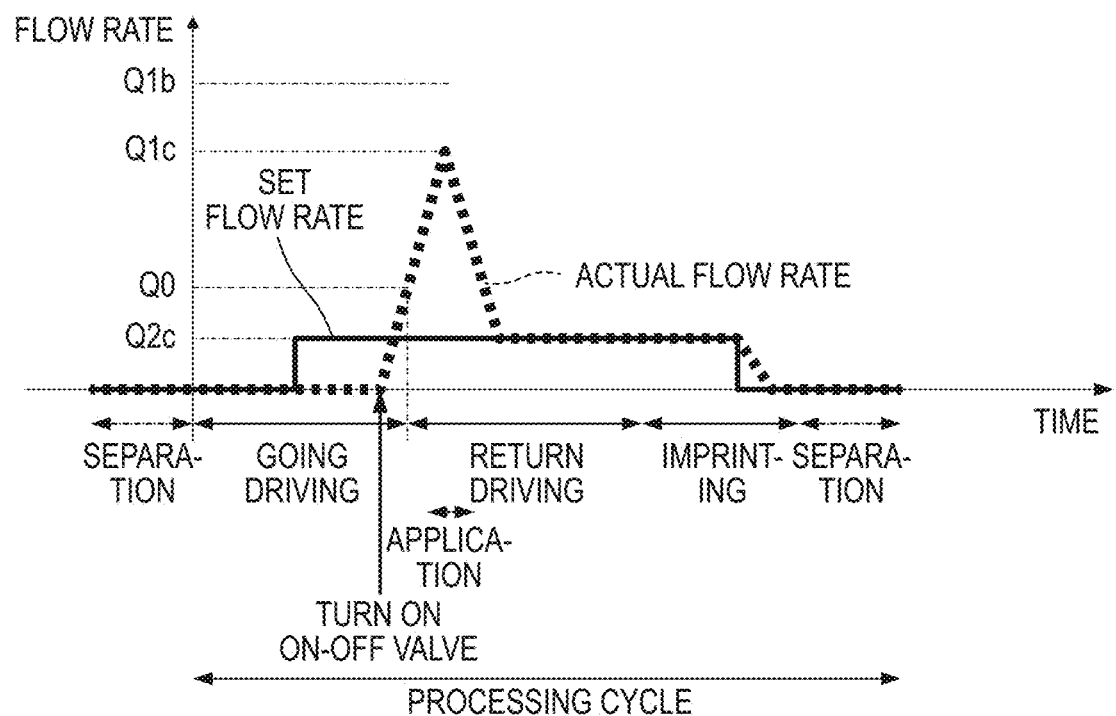
FIG. 5B is a graph showing the supply control of a purge gas in one processing cycle according to the third embodiment.

An imprint apparatus 1 according to the third embodiment of the present invention will be described below with reference to FIGS. 5A and 5B. Matters that are not mentioned as the third embodiment can comply with the second embodiment. FIG. 5A shows the arrangement of a gas supply GS in the imprint apparatus 1 according to the third embodiment of the present invention. FIG. 5B shows the supply control of a purge gas in one processing cycle according to the third embodiment. Note that a notation in FIG. 5B complies with a notation in FIG. 3B. FIG. 5A does not show gas supply ports 61 to 63 and flow rate regulating mechanisms 111 to 113. However, they can have the same arrangement as a gas supply port 64 and a flow rate regulating mechanism 114. In a driving period, supply of the purge gas from the gas supply ports 61 to 63 may be controlled auxiliarily or in the same manner as supply of the purge gas from the gas supply port 64. Alternatively, in the driving period, the purge gas may not be supplied from the gas supply ports 61 to 63.

The gas supply GS of the third embodiment includes the flow rate regulating mechanism 114 arranged between a gas supply source and the gas supply port 64. The flow rate regulating mechanism 114 includes a flow rate limiting valve 134 in addition to a flow rate regulator 119, an on-off valve 124, and a controller 130. The flow rate limiting valve 134 can be arranged at an arbitrary position between the gas supply source and the gas supply port 64. The flow rate limiting valve 134 limits a maximum value of the flow rate of a gas supplied onto a substrate S by the gas supply GS. The flow rate regulating mechanism 114 of the third embodiment has an arrangement obtained by adding the flow rate limiting valve 134 to the flow rate regulating mechanism 114 of the second embodiment.

In the third embodiment, the controller 130 changes a flow rate command value given to the flow rate regulator 119 from 0 to a first command value Q2c at the first timing which is earlier than a start timing of return driving as an example of a reference timing in a period when the on-off valve 124 is in a closed state. The first command value Q2c is smaller than Q0 and larger than 0. Subsequently, the controller 130 changes the on-off valve 124 from the closed state to an open state at the second timing which is earlier than the start timing of return driving but later than the first timing. That is, the controller 130 sets the on-off valve 124 in the closed state and sets the flow rate command value for the flow rate regulator 119 to the first command value Q2c, and then the controller 130 sets the on-off valve 124 in the open state. Consequently, the flow rate of a purge gas supplied onto the substrate S by the gas supply GS increases up to Q1c, and then decreases, in a period during which the substrate S is driven by a substrate positioning mechanism SA so that a shot region where an imprint material is arranged is moved under a mold M. Note that Q1c is smaller than Q1b in the second embodiment and is decided by the opening rate set in the flow rate limiting valve 134. That is, when the flow rate of a purge gas passing through the flow rate regulator 119 overshoots beyond Q2c (and Q0), the flow rate limiting valve 134 limits a maximum value of the flow rate to Q1c which is smaller than Q1b.

In the third embodiment as well, the flow rate of the purge gas supplied onto the substrate S by the gas supply GS starts to decrease in the period during which the substrate S is driven by the substrate positioning mechanism SA so that the shot region where the imprint material is arranged is moved under the mold M.

In the example of FIG. 5B, the flow rate of a gas supplied onto the substrate S increases, and then decreases, in the period during which the substrate S is driven by the substrate positioning mechanism SA so that the shot region where the imprint material is arranged is moved under the mold M. Moreover, in the example of FIG. 5B, the flow rate of the gas supplied onto the substrate S increases, and then decreases, and then becomes constant, in the period during which the substrate S is driven by the substrate positioning mechanism SA so that the shot region where the imprint material is arranged is moved under the mold M.

The opening rate of the flow rate limiting valve 134 can be regulated so that, for example, the purge gas passing through the flow rate regulator 119 becomes Q1c in a state in which the opening rate of the flow rate regulator 119 is set at maximum.

Figure 6A:
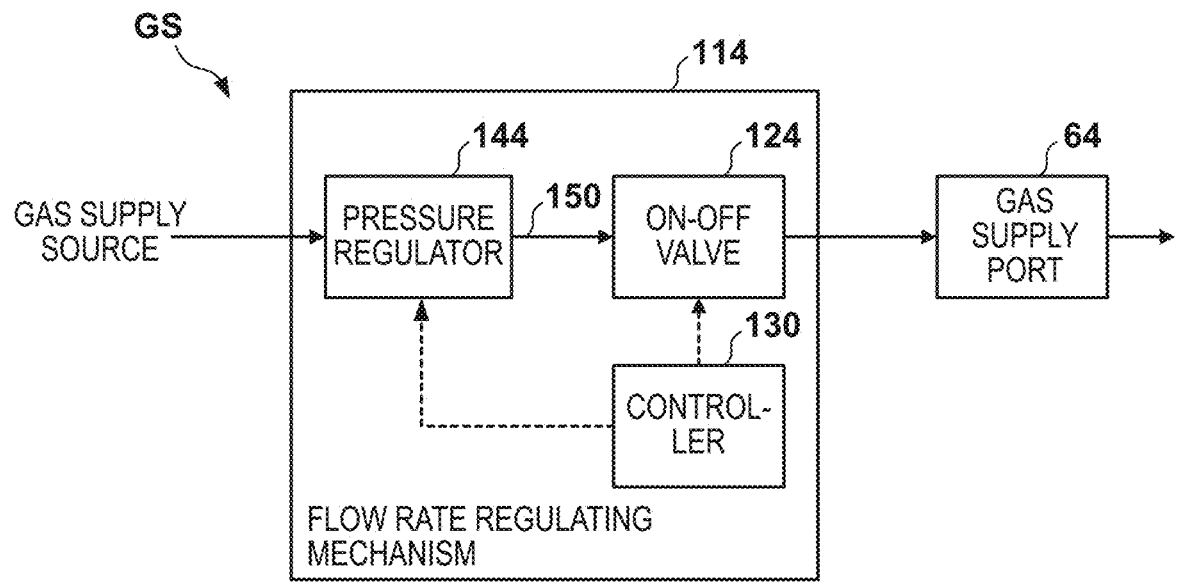
FIG. 6A is a block diagram showing the arrangement of a gas supply according to the fourth embodiment.
Figure 6B:
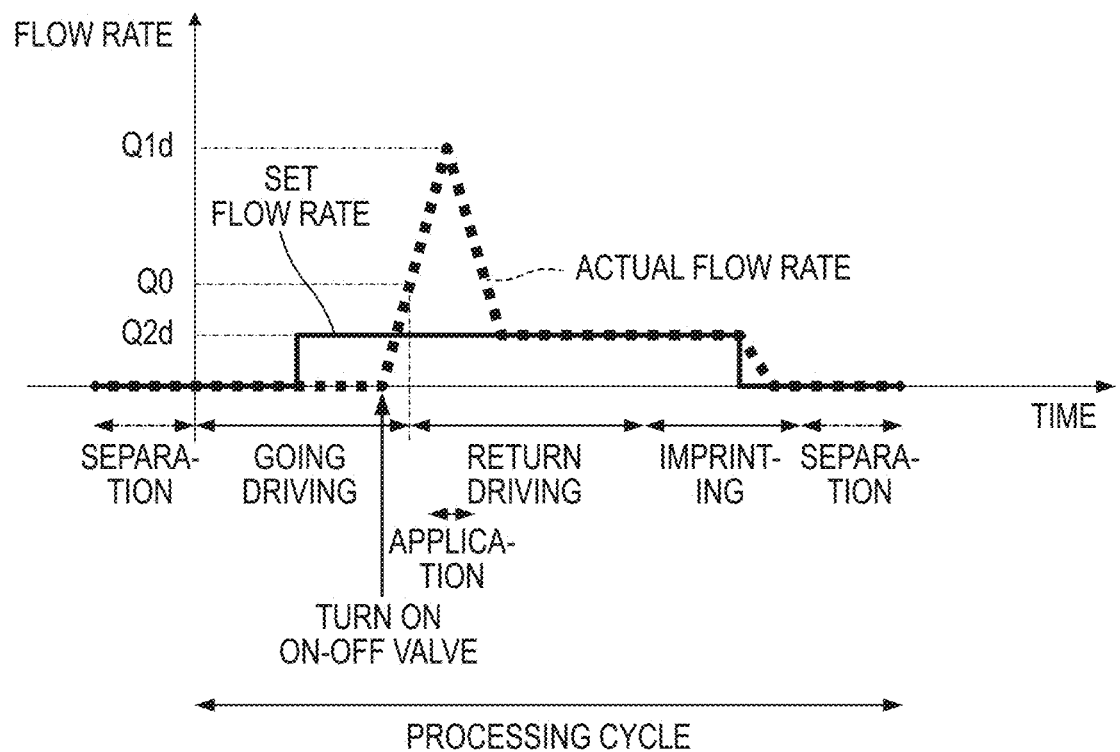
FIG. 6B is a graph showing the supply control of a purge gas in one processing cycle according to the fourth embodiment.

An imprint apparatus 1 according to the fourth embodiment of the present invention will be described below with reference to FIGS. 6A and 6B. Matters that are not mentioned as the fourth embodiment can comply with the first to third embodiments. FIG. 6A shows the arrangement of a gas supply GS in the imprint apparatus 1 according to the fourth embodiment of the present invention. FIG. 6B shows the supply control of a purge gas in one processing cycle according to the fourth embodiment. Note that a notation in FIG. 6B complies with a notation in FIG. 3B. FIG. 6A does not show gas supply ports 61 to 63 and flow rate regulating mechanisms 111 to 113. However, they can have the same arrangement as a gas supply port 64 and a flow rate regulating mechanism 114. In a driving period, supply of the purge gas from the gas supply ports 61 to 63 may be controlled auxiliarily or in the same manner as supply of the purge gas from the gas supply port 64. Alternatively, in the driving period, the purge gas may not be supplied from the gas supply ports 61 to 63.

The gas supply GS of the fourth embodiment includes the flow rate regulating mechanism 114 arranged between a gas supply source and the gas supply port 64. The flow rate regulating mechanism 114 can include an on-off valve 124, a pressure regulator 144, and a controller 130. The on-off valve 124 is arranged between the gas supply port 64 and the gas supply source. The pressure regulator 144 is arranged between the on-off valve 124 and the gas supply source. The controller 130 controls the pressure regulator 144 and the on-off valve 124. The controller 130 may be shared in the flow rate regulating mechanisms 111 to 114. The pressure regulator 144 is configured to regulate the pressure of a communication path 150 that communicates the pressure regulator 144 and the on-off valve 124.

In the fourth embodiment, the controller 130 changes a pressure command value given to the pressure regulator 144 such that the flow rate of the purge gas becomes a flow rate Q2d corresponding to Q2a, Q2b, and Q2c at the first timing which is earlier than a reference timing (here, the start timing of return driving) in a period when the on-off valve 124 is in a closed state. The flow rate Q2d is smaller than Q0 and larger than 0.

Subsequently, the controller 130 changes the on-off valve 124 from the closed state to an open state at the second timing which is earlier than the start timing of return driving but later than the first timing. That is, the controller 130 sets the on-off valve 124 in the closed state, and the pressure regulator 144 regulates the pressure of the communication path 150, and then the controller 130 sets the on-off valve 124 in the open state. Consequently, the flow rate of a purge gas supplied onto a substrate S by the gas supply GS increases up to Qld, and then decreases, in a period during which the substrate S is driven by a substrate positioning mechanism SA so that a shot region where an imprint material is arranged is moved under a mold M.

In general, the pressure regulator has a simpler arrangement than the flow rate regulator and is inexpensive. Hence, the fourth embodiment is advantageous in simplifying a structure and reducing cost.

A pattern of a cured product formed using the imprint apparatus is used permanently for at least some of various articles or used temporarily to manufacture various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAIVI and a semiconductor element such as an LSI, a CCD, an image sensor, or an FPGA. An example of the mold is an imprinting mold.

The pattern of the cured product is used intact as a constituent member of some of the above-described articles or used temporarily as a resist mask. The resist mask is removed after etching, ion implantation, or the like is performed in a processing step of the substrate.

Figure 8A:
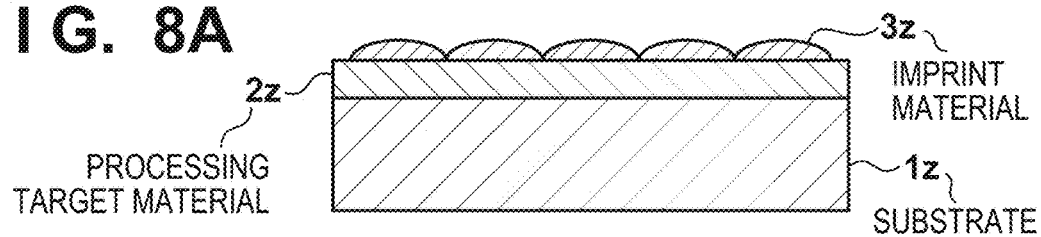
FIGS. 8A to 8F are views showing an article manufacturing method.

An article manufacturing method of forming a pattern on a substrate by an imprint apparatus, processing the substrate on which the pattern has been formed, and manufacturing an article from the substrate on which the process has been performed will be described next. As shown in FIG. 8A, a substrate 1z such as a silicon wafer having a processing target material 2z such as an insulator formed on its surface is prepared, and then an imprint material 3z is applied onto the surface of the processing target material 2z by an inkjet method or the like. A state in which the imprint material 3z formed into a plurality of droplets is applied onto the substrate is shown here.

Figure 8B:
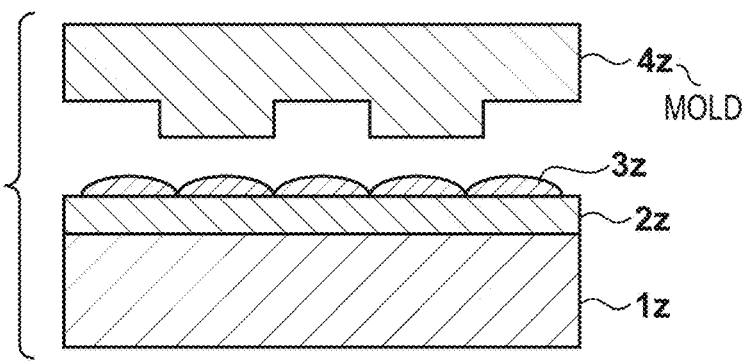
Figure 8C:
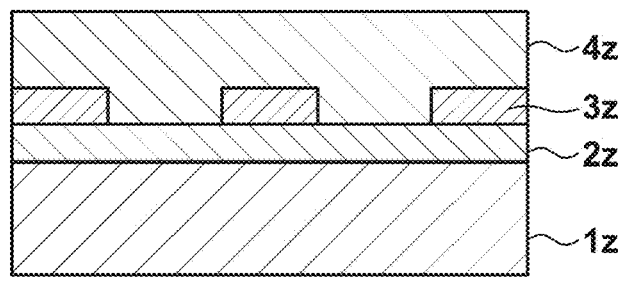

As shown in FIG. 8B, a side of an imprinting mold 4z on which its three-dimensional pattern is formed faces the imprint material 3z on the substrate. As shown in FIG. 8C, the mold 4z and the substrate 1z to which the imprint material 3z is applied are brought into contact with each other, and a pressure is applied. A gap between the mold 4z and the processing target material 2z is filled with the imprint material 3z. When the imprint material 3z is irradiated with light as curing energy through the mold 4z in this state, the imprint material 3z is cured.

Figure 8D:
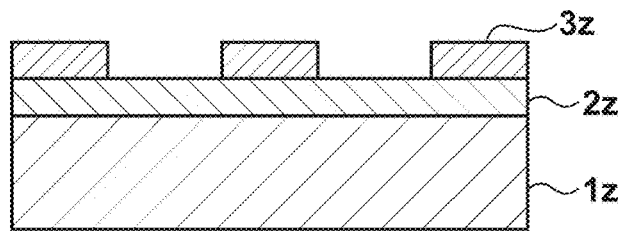

As shown in FIG. 8D, the pattern of the cured product of the imprint material 3z is formed on the substrate 1z by separating the mold 4z and the substrate 1z from each other after curing the imprint material 3z. The pattern of this cured product has a shape such that the concave portion of the mold corresponds to the convex portion of the cured product, and the convex portion of the mold corresponds to the concave portion of the cured product. That is, the three-dimensional pattern of the mold 4z is transferred to the imprint material 3z.

Figure 8E:
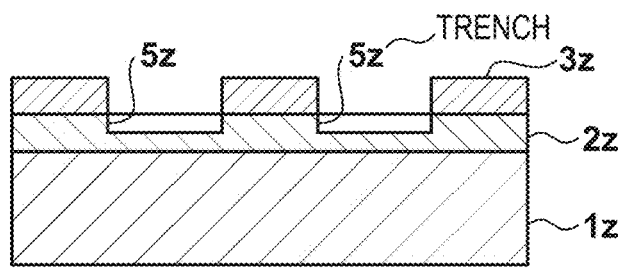
Figure 8F:
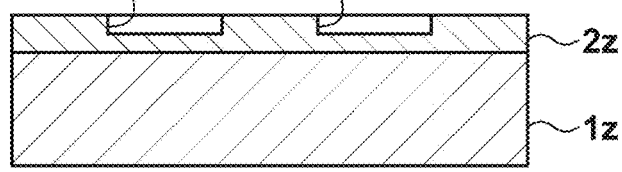

As shown in FIG. 8E, out of the surface of the processing target material 2z, portions without any cured product or portions where the cured products remain thin are removed to form trenches 5z by performing etching using the pattern of the cured product as an etching resistant mask. As shown in FIG. 8F, an article having the trenches 5z formed in the surface of the processing target material 2z can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

A shaping apparatus according to the fifth embodiment of the present invention will be described below with reference to FIGS. 9A to 9D. Each of the first to fourth embodiments shows an example in which the shaping apparatus according to the present invention is applied to a process of transferring a pattern of a mold (template) to a substrate. The fifth embodiment shows an example in which the shaping apparatus according to the present invention is applied to planarization processing. A mold (planar template) used in the fifth embodiment does not include a pattern. An underlying pattern on a substrate has a three-dimensional profile due to a pattern formed by a preceding process. Particularly in recent years, in accordance with the increase in the multi-layered structure of memory elements, a substrate that has undergone a process has a step of about 100 nm has appeared. A step that has been caused by mild warping of the entire substrate can be handled by a focus following function of a scan exposure apparatus which is used in a photolithographic process. However, a three-dimensional pattern with a fine pitch that falls within an exposure slit area of the scan exposure apparatus will consume the DOF (Depth Of Focus) of the scan exposure apparatus.

As a method of smoothing the underlying pattern on the substrate, there are methods that form a planarization layer such as SOC (Spin On Carbon) and CMP (Chemical Mechanical Polishing). However, an existing technique is problematic in that it cannot obtain a sufficient planarization performance because the three-dimensional pattern suppression factor is 40% to 70% in a boundary portion between an isolated pattern area A and a repetitive dense (line and space density) pattern area B in FIG. 9A. Hence, the three-dimensional differences in the underlying pattern caused by multi-layering will tend to further increase in the future.

As a solution to this problem, U.S. Pat. No. 9,415,418 proposes a method of forming a contiguous film by dispensing a resist that is to be a planarization layer by an inkjet dispenser and imprinting the dispensed resist by a planar template. In addition, U.S. Pat. No. 8,394,282 proposes a method of reflecting a topographical measurement result on the wafer side onto the density information of each position that is to be designated for coating by the inkjet dispenser.

In the fifth embodiment, the present invention is applied to a planarization apparatus that performs local planarization on a substrates surface by pressing a planar template onto an uncured composition (resist) that has been dispensed in advance particularly.

Figure 9A:
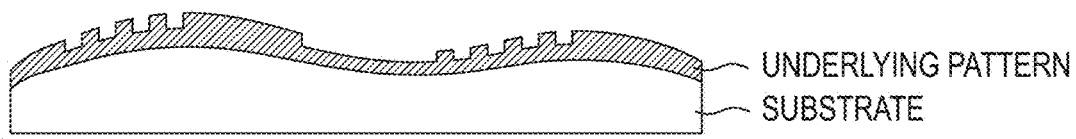
FIGS. 9A to 9D are views showing a shaping method according to the fifth embodiment.

FIG. 9A shows a substrate (wafer) before planarization. Reference character A schematically indicates the isolated pattern area, that is, a region having the small area of a pattern convex portion, and reference character B schematically indicates the dense area and here a region having a 1:1 ratio of the area occupied by a pattern convex portion to the area occupied by a pattern concave portion. The value of the average height of the isolated pattern area A and the dense area B changes in accordance with the ratio occupied by the convex portions.

Figure 9B:
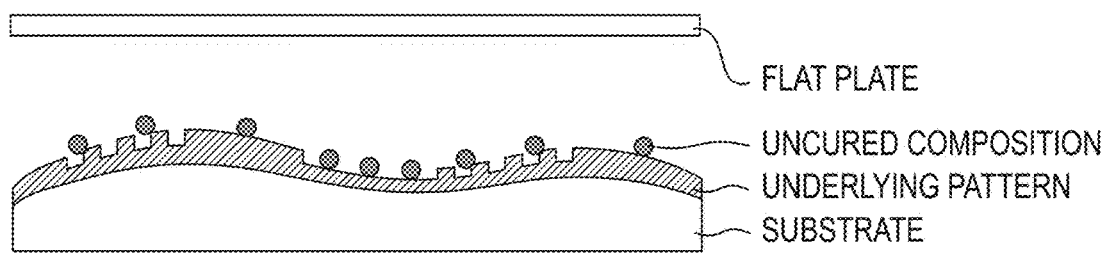
Figure 9C:
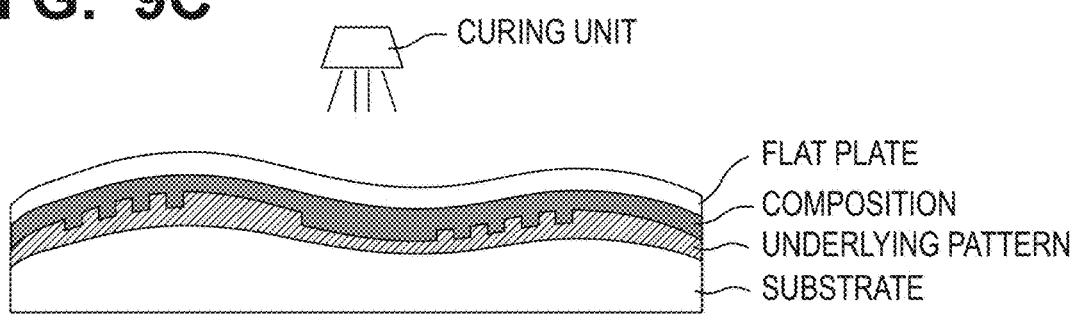

FIG. 9B schematically shows a state in which a composition (resist) that is to form a planarization layer has been dispensed on the substrate. The composition may be dispensed on the substrate, for example, by using the inkjet dispenser as described in U.S. Pat. No. 9,415,418, by using a spin coater, or in accordance with another method. FIG. 9C schematically shows a process in which a planar template is pressed onto the composition (resist) on the substrate, and the composition is cured by irradiating the composition with curing energy in that state. The planar template can be formed from, for example, glass or quartz that transmits ultraviolet rays serving as curing energy. The planar template is deformed following the profile of the substrate surface with respect to the mild concave-convex portions of the entire substrate.

Figure 9D:
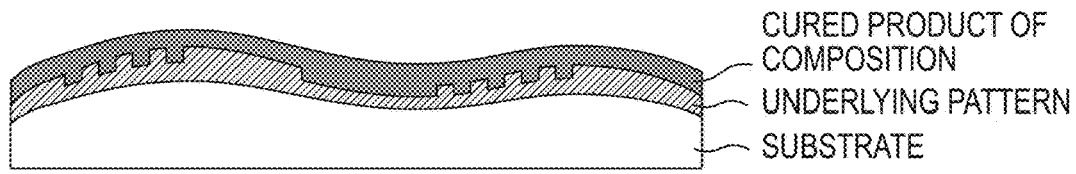

FIG. 9D schematically shows a state in which the planar template is separated from the cured composition. The fifth embodiment is also advantageous in reducing the use amount of a gas to be supplied between the substrate and a mold. The shaping apparatus of the fifth embodiment can have the same arrangement as the imprint apparatus 1 shown in FIG. 1. However, the shaping apparatus may adopt a simpler arrangement because the apparatus is not required to have a high accuracy concerning positioning between the substrate and the mold. Giving a description with reference to FIG. 1, the shaping apparatus can include the substrate positioning mechanism SA that positions the substrate S, the mold positioning mechanism MA that positions the mold M, and the dispenser 32 that arranges the composition on the substrate S (or the shot region of the substrate S). The shaping apparatus can also include the gas supply GS. The gas supply GS can include gas supply ports arranged between the dispenser 32 and the mold positioning mechanism MA, and supply a gas onto the substrate S from the gas supply ports in a state in which the substrate S is driven by the substrate positioning mechanism SA. The flow rate of the gas supplied onto the substrate S by the gas supply GS can start to decrease in a period during which the substrate S is driven by the substrate positioning mechanism SA so that the substrate S (or the shot region of the substrate S) where the composition is arranged by the dispenser 32 is moved under the mold M.

An article manufacturing method of manufacturing an article by using the above-described shaping apparatus includes a step of forming a cured product of the composition on the substrate by using the shaping apparatus and a step of performing a process for the substrate where the cured product has been formed in the preceding process, manufacturing an article from the substrate that has undergone the process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-187989, filed Sep. 28, 2017 and Japanese Patent Application No. 2018-137097, filed Jul. 20, 2018, which are hereby incorporated by reference herein in their entirety.

What is claimed is:

1. A shaping apparatus that shapes a composition on a substrate using a mold, the apparatus comprising:
    a substrate positioning mechanism configured to position the substrate;
    a mold positioning mechanism configured to position the mold;
    a dispenser configured to arrange the composition on a shot region of the substrate; and
    a gas supply configured to supply gas onto the substrate, and including:
        a gas supply port arranged between the dispenser and the mold positioning mechanism, and configured to supply gas onto the substrate from the gas supply port; and
        a controller configured to control a flow rate of the gas supplied onto the substrate so that the flow rate of the gas supplied onto the substrate starts to decrease in a period during which the substrate is being driven by the substrate positioning mechanism such that the shot region where the composition is arranged by the dispenser is moved under the mold.

2. The apparatus according to claim 1, wherein the controller is further configured to control the flow rate of the gas so that the flow rate of the gas increases and then decreases, in the period during which the substrate is driven by the substrate positioning mechanism such that the shot region where the composition is arranged by the dispenser is moved under the mold.

3. The apparatus according to claim 2, wherein:
the gas supply further includes:
an on-off valve arranged between the gas supply port and a gas supply source; and
a pressure regulator arranged between the on-off valve and the gas supply source, and configured to regulate pressure of a communication path configured to communicate the pressure regulator and the on-off valve, and
the controller is further configured to control the on-off valve and the pressure regulator so that the flow rate of the gas supplied onto the substrate increases and then decreases, in the period, by setting the on-off valve in a closed state and regulating the pressure of the communication path by the pressure regulator, and then setting the on-off valve in an open state.

4. The apparatus according to claim 1, wherein the controller is further configured to control the flow rate of the gas so that the flow rate of the gas increases and then decreases, and then becomes constant, in the period during which the substrate is being driven by the substrate positioning mechanism such that the shot region where the composition is arranged by the dispenser is moved under the mold.

5. The apparatus according to claim 1, wherein the controller is further configured to control the gas supplied on to the substrate so as to be started in a period during which the substrate is being driven by the substrate positioning mechanism so that the shot region where the composition is to be arranged by the dispenser is moved apart from a position under the mold.

6. The apparatus according to claim 1, wherein the controller is further configured to control the gas supplied on to the substrate so as to be started after the substrate positioning mechanism starts to drive the substrate so that the shot region where the composition is to be arranged by the dispenser is moved closer to the dispenser and before the dispenser starts to supply the composition to the shot region.

7. The apparatus according to claim 1, wherein the controller is further configured to control the gas supplied on to the substrate so as to be stopped before separation between the mold and a cured composition is complete.

8. The apparatus according to claim 1, wherein the gas supply includes a plurality of gas supply ports, including the gas supply port, arranged on a periphery of the mold.

9. An article manufacturing method comprising:
forming a cured product of a composition on a substrate using the shaping apparatus according to claim 1; and
performing a process for the substrate where the cured product has been formed in the forming,
wherein an article is manufactured from the substrate that has undergone the process.

10. A shaping apparatus for shaping a composition on a substrate using a mold, the apparatus comprising:
a substrate positioning mechanism configured to position the substrate;
a mold positioning mechanism configured to position the mold;
a dispenser configured to arrange the composition on the substrate; and a gas supply configured to supply gas onto the substrate, and including:
a gas supply port arranged between the dispenser and the mold positioning mechanism, and configured to supply gas onto the substrate from the gas supply port in a state in which the substrate is being driven by the substrate positioning mechanism; and
a controller configured to control a flow rate of the gas supplied onto the substrate so that the flow rate of the gas supplied onto the substrate starts to decrease in a period during which the substrate is driven by the substrate positioning mechanism such that the substrate where the composition is arranged by the dispenser is moved under the mold.

11. An article manufacturing method comprising:
forming a cured product of a composition on a substrate using the shaping apparatus according to claim 10; and
performing a process for the substrate where the cured product has been formed in the forming,
wherein an article is manufactured from the substrate that has undergone the process.

12. A shaping apparatus that shapes a composition on a substrate using a mold, the apparatus comprising:
a substrate positioning mechanism configured to position the substrate;
a mold positioning mechanism configured to position the mold;
a dispenser configured to arrange the composition on a shot region of the substrate; and
a gas supply including a gas supply port arranged between the dispenser and the mold positioning mechanism, and configured to supply gas onto the substrate from the gas supply port in a state in which the substrate is being driven by the substrate positioning mechanism,
wherein a flow rate of the gas supplied onto the substrate by the gas supply increases and then decreases, in a period during which the substrate is being driven by the substrate positioning mechanism so that the shot region where the composition is arranged by the dispenser is moved under the mold,
wherein the gas supply includes:
a flow rate regulator arranged between the gas supply port and a gas supply source;
an on-off valve arranged between the gas supply port and the gas supply source; and
a controller configured to control the flow rate regulator and the on-off valve,
wherein the flow rate regulator is configured to perform, based on a flow rate command value transmitted from the controller, feedback control of a flow rate of a gas passing through the flow rate regulator, and
wherein the controller increases the flow rate of the gas supplied onto the substrate by the gas supply and then decreases the flow rate, in the period, by setting the on-off valve in a closed state and setting the flow rate command value to a first command value that is larger than 0, and then setting the on-off valve in an open state.

13. The apparatus according to claim 12, wherein the gas supply further includes a flow rate limiting valve configured to limit a maximum value of the flow rate of the gas supplied onto the substrate by the gas supply.

* * * * *